(12) United States Patent
Strachan et al.

(10) Patent No.: US 9,859,513 B2
(45) Date of Patent: Jan. 2, 2018

(54) INTEGRATED MULTI-TERMINAL DEVICES CONSISTING OF CARBON NANOTUBE, FEW-LAYER GRAPHENE NANOGAPS AND FEW-LAYER GRAPHENE NANORIBBONS HAVING CRYSTALLOGRAPHICALLY CONTROLLED INTERFACES

(71) Applicant: UNIVERSITY OF KENTUCKY RESEARCH FOUNDATION, Lexington, KY (US)

(72) Inventors: Douglas Robert Strachan, Lexington, KY (US); David Patrick Hunley, Lexington, KY (US)

(73) Assignee: UNIVERSITY OF KENTUCKY RESEARCH FOUNDATION, Lexington, KY (US)

( * ) Notice: Subject to any disclaimer, the term of this patent is extended or adjusted under 35 U.S.C. 154(b) by 0 days.

(21) Appl. No.: 14/952,511

(22) Filed: Nov. 25, 2015

(65) Prior Publication Data
US 2016/0155971 A1    Jun. 2, 2016

Related U.S. Application Data

(60) Provisional application No. 62/084,283, filed on Nov. 25, 2014, provisional application No. 62/091,192, filed on Dec. 12, 2014.

(51) Int. Cl.
*H01L 51/05* (2006.01)
*H01L 29/06* (2006.01)
(Continued)

(52) U.S. Cl.
CPC ...... *H01L 51/0558* (2013.01); *H01L 29/0673* (2013.01); *H01L 29/413* (2013.01); *H01L 29/66439* (2013.01); *H01L 29/778* (2013.01); *H01L 29/1606* (2013.01); *H01L 29/24* (2013.01); *H01L 29/42356* (2013.01); *H01L 29/518* (2013.01)

(58) Field of Classification Search
CPC .......................... H01L 51/0558; H01L 29/66
USPC .......................................................... 257/29
See application file for complete search history.

(56) References Cited

U.S. PATENT DOCUMENTS 5,958,358 A    9/1999  Tenne et al.
7,327,000 B2   2/2008  DeHeer et al.
(Continued)

FOREIGN PATENT DOCUMENTS

JP    2011159820 A    8/2011
WO    2009149005 A1   12/2009
WO    2014182169 A2   11/2014

OTHER PUBLICATIONS

Son et al., Nature 2006, 444, 347-349.
(Continued)

*Primary Examiner* — Marc Armand
*Assistant Examiner* — Warren H Kilpatrick
(74) *Attorney, Agent, or Firm* — King & Schickli, PLLC

(57) ABSTRACT

The present invention relates to atomically-thin channel materials with crystallographically uniform interfaces to atomically-thin commensurate graphene electrodes and/or nanoribbons separated by nanogaps that allow for nanoelectronics based on quantum transport effects and having significantly improved contact resistances.

22 Claims, 11 Drawing Sheets

(51) Int. Cl.
  H01L 29/66 (2006.01)
  H01L 29/778 (2006.01)
  H01L 29/41 (2006.01)
  H01L 29/16 (2006.01)
  H01L 29/423 (2006.01)
  H01L 29/51 (2006.01)
  H01L 29/24 (2006.01)

(56) References Cited

U.S. PATENT DOCUMENTS

| | | | |
|---|---|---|---|
| 7,619,257 B2 | 11/2009 | Pfeiffer et al. | |
| 8,053,782 B2 | 11/2011 | Avouris et al. | |
| 8,057,863 B2 | 11/2011 | Liang | |
| 8,236,626 B2 | 8/2012 | Dai et al. | |
| 8,361,853 B2 | 1/2013 | Cohen et al. | |
| 8,480,931 B2 | 7/2013 | Choi et al. | |
| 8,624,223 B2 | 1/2014 | Chen et al. | |
| 8,698,226 B2 | 4/2014 | Jain et al. | |
| 8,759,824 B2 | 6/2014 | Dimitrakopoulos et al. | |
| 8,803,131 B2 | 8/2014 | Lin et al. | |
| 8,932,941 B2 | 1/2015 | Lee et al. | |
| 8,964,491 B2 | 2/2015 | Schuette | |
| 8,999,820 B2 | 4/2015 | Byun et al. | |
| 9,029,836 B2 | 5/2015 | Park et al. | |
| 9,040,958 B2 | 5/2015 | Lee et al. | |
| 9,093,507 B2 | 7/2015 | Cohen et al. | |
| 9,093,509 B2 | 7/2015 | Heo et al. | |
| 9,145,295 B2 | 9/2015 | Peng | |
| 2009/0174435 A1 | 7/2009 | Stan et al. | |
| 2010/0102292 A1* | 4/2010 | Hiura | B82Y 10/00 257/9 |
| 2012/0034707 A1 | 2/2012 | Datta et al. | |
| 2012/0272868 A1 | 11/2012 | Berry et al. | |
| 2013/0033310 A1 | 2/2013 | Liu | |
| 2014/0034906 A1 | 2/2014 | Wong et al. | |
| 2014/0235123 A1 | 8/2014 | Lin et al. | |
| 2015/0249034 A1 | 9/2015 | Kondo et al. | |

OTHER PUBLICATIONS

Son et al., Phys. Rev. Lett. 2006, 97.
Standley et al., Nano Letters 2008, 8, 3345-3349.
Tomita et al., J. Phys. Chem. 1974, 78, 2254-2258.
Tsutsui et al., Sensors 2012, 12, 7259-7298.
Wang et al., Phys. Rev. Lett. 2008, 100, 206803.
Wong et al., Science 1997 277: 1971.
Xia et al., Nature Nanotechnology 6: 179 (2011).
Yakobson et al., Phys Rev Lett 1996 76: 2511.
Barone, et al., Nano Letters, 2006, 6, 2748-2754.
Borrnert, et al., ACS Nano 2012, 6, 10327-10334.
Brown et al., Nanotechnology 2012, 23.
Buia et al., Phys. Rev. B 67: 113409 (2003).
Buldum et al., Phys. Rev. B 63:161403 (2001).
Cai et al., Nature 2010, 466, 470-473.
Campos et al., Nano Letters 2009, 9, 2600-2604.
Chen et al., Physica E 2007, 40, 228-232.
Cherniavskaya et al., Journal of Physical Chemistry B 2003, 107, 1525-1531.
Cook et al. Appl., Phys. Lett. 2012 , 101, 153501.
Cruz-Silva et al., Physical Review Letters 2010, 105.
Datta et al., Nano Letters 2008, 8, 1912-1915.
Datta et al., Nano Letters 2009, 9, 7-11.
Emerging Research Materials International Technology Roadmap for Semiconductors 2011.
Fischbein et al., Applied Physics Letters 2008, 93, 113107-113103.
Franklin et al., Nano Letters, 12: 758 (2012).
Franklin et al., Nature Nanotechnology 2010, 5, 858-862.
Geim et al.. Nature Materials, 6: 183 (2007).
Geim et al., Physics Today 2007, 60, 35-41.
Guimaraes et al., Physical Review B 2012, 85.
Guriyanova et al., Meas. Sci. Technol. 2010, 21.
Han et al., Phys. Rev. Lett. 2007, 98.
Hipps et al., Science 294: 536 (2001).
Hunley et al., ACS Nano 2011, 5, 6403-6409.
Jacobs et al., Journal of Applied Physics 1998, 84, 1168-1173.
Jia et al., Nanoscale 2011, 3, 86-95.
Jia et al., Science 2009, 323, 1701-1705.
Jiao et al., Nano Research 2012, 5, 292-296.
Jiao et al., Nature 2009, 458, 877-880.
Jiao et al., Nature Nanotechnology 2010, 5, 321-325.
Kane et al., Nano Letters, 2009 , 9 , 3586.
Kim et al., ACS Nano 2010, 4, 1362-1366.
Kosynkin et al., Nature 2009, 458, 872-876.
Lee et al., Science 2008, 321, 385.
Liao et al., Phys. Rev. Lett 2011 , 106 , 256801.
Lu et al., Nano Letters 2011, 11, 5184-5188.
Lu et al., Nature Materials 6:841 (2007).
Lu et al., Small Journal, 2010, 6, 2748-2754.
Luo et al., Nano Letters 2010 10: 777-781.
Maarouf et al., Phys. Rev. B 83:045402 (2011).
Moser et al., Applied Physics Letters 2009, 95, 173506-173503.
Murali et al., Appl. Phys. Lett 2009, 94: 243114.
Nakada et al., Physical Review B 1996, 54, 17954-17961.
Narita et al., Nat. Chem. 2014, 6, 126-132.
Nasseri et al., Carbon 2014, 77, 958-963.
Novoselov et al., Science 2004, 306, 666-669.
Ponomarenko et al., Science 2008, 320, 356-358.
Prins et al., Nano Letters 2011 , 11 , 4607.
Ribes et al., IEEE Trans. Device Mater. Reliab., 2005 8: 1912.
Ru Phys Rev B 2000 62: 9973.
English Machine Translation of JP 2011159820(A).

* cited by examiner

Figure 2
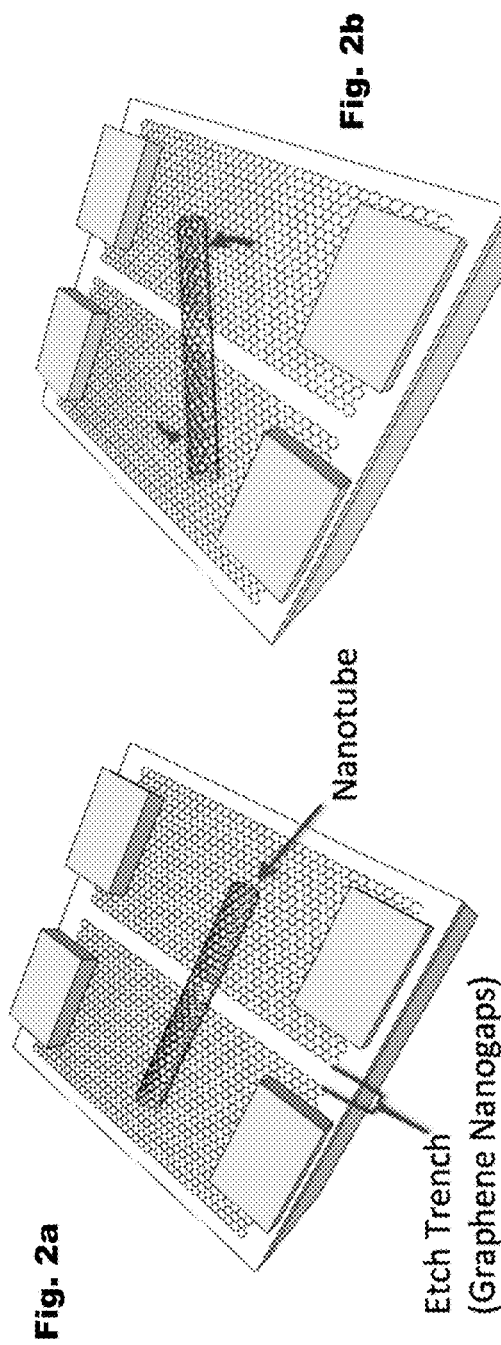
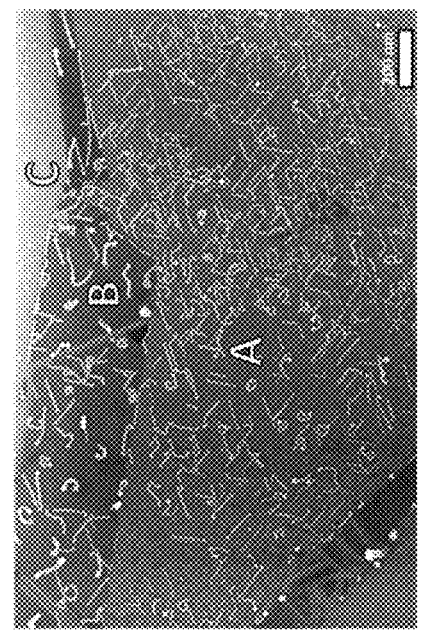
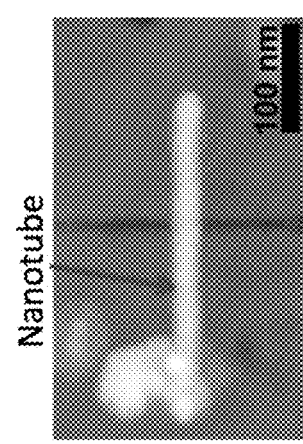

Figure 4
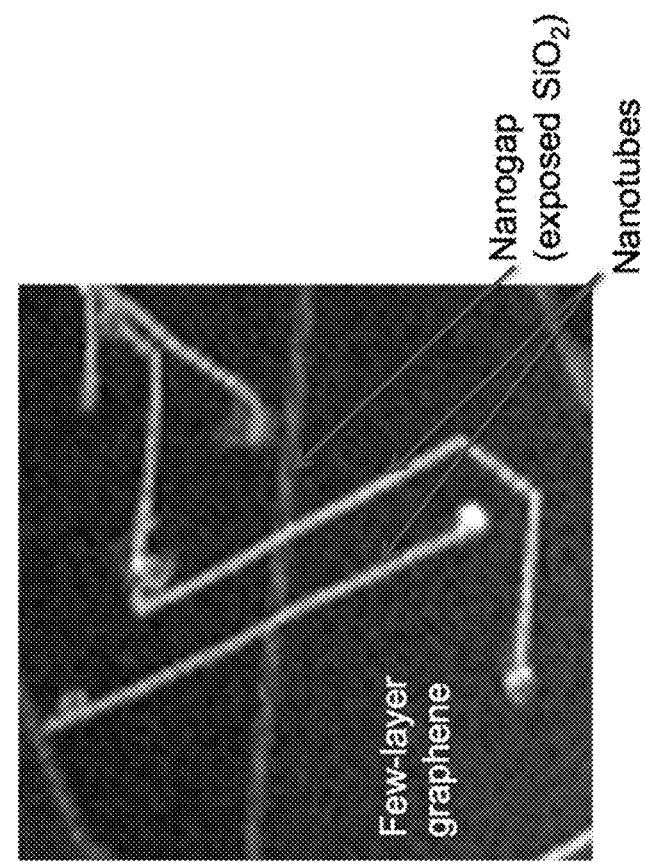
Fig. 4b
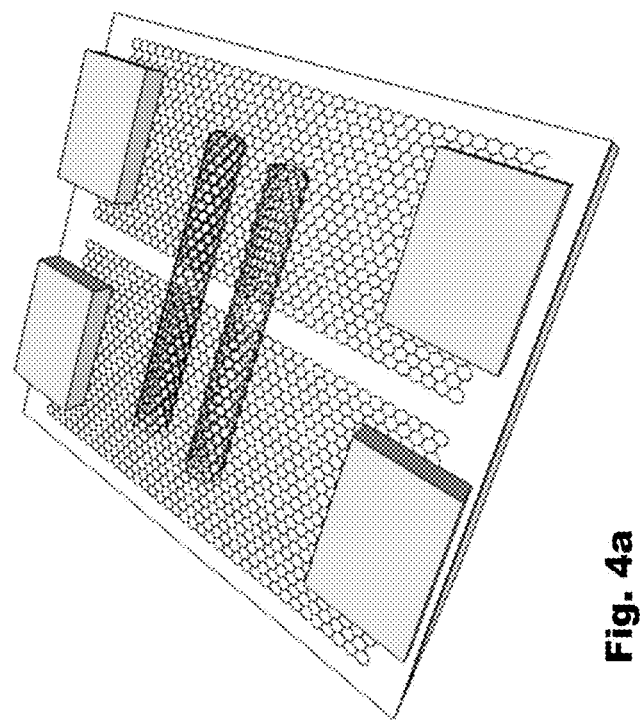
Fig. 4a

Figure 5 cont.
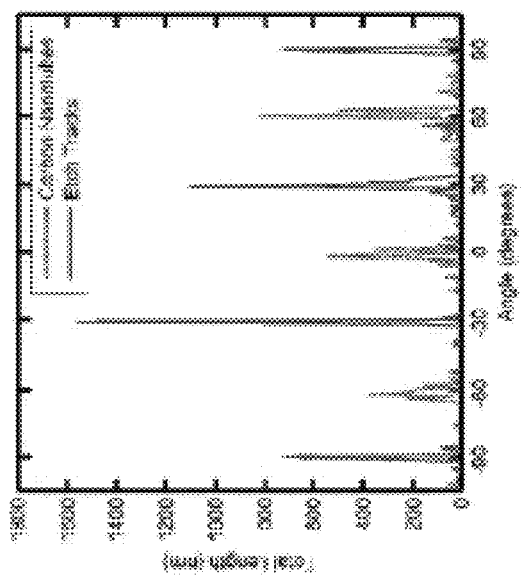
Fig. 5b
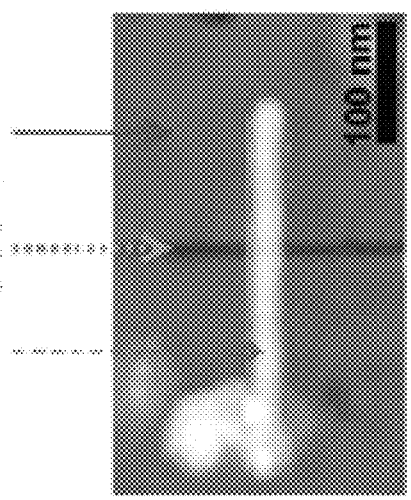
Fig. 5c

Figure 8 cont.
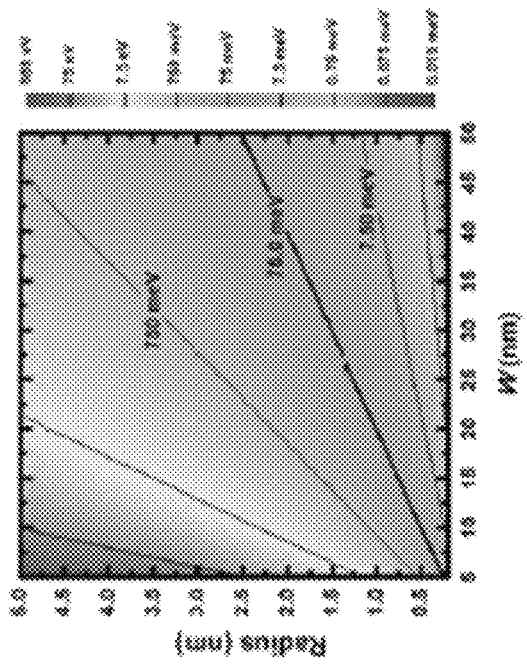
Fig. 8c
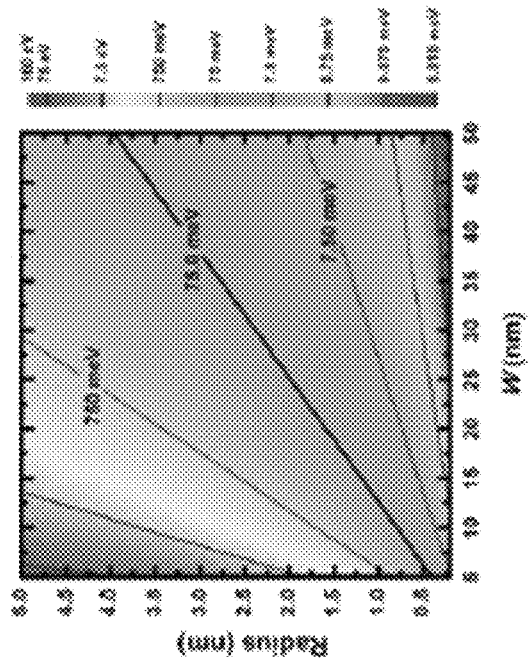
Fig. 8d

Figure 9
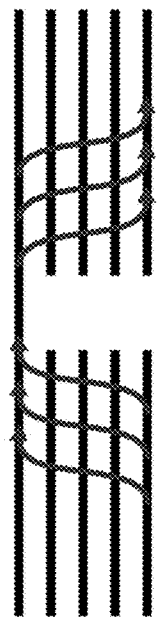
Fig. 9c
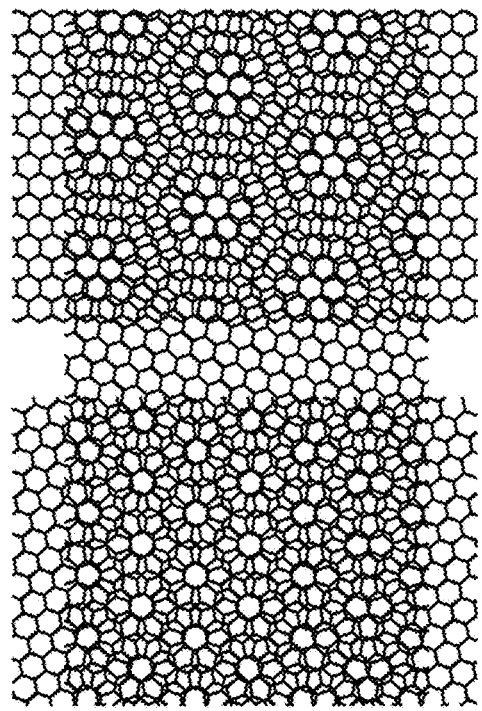
Fig. 9d
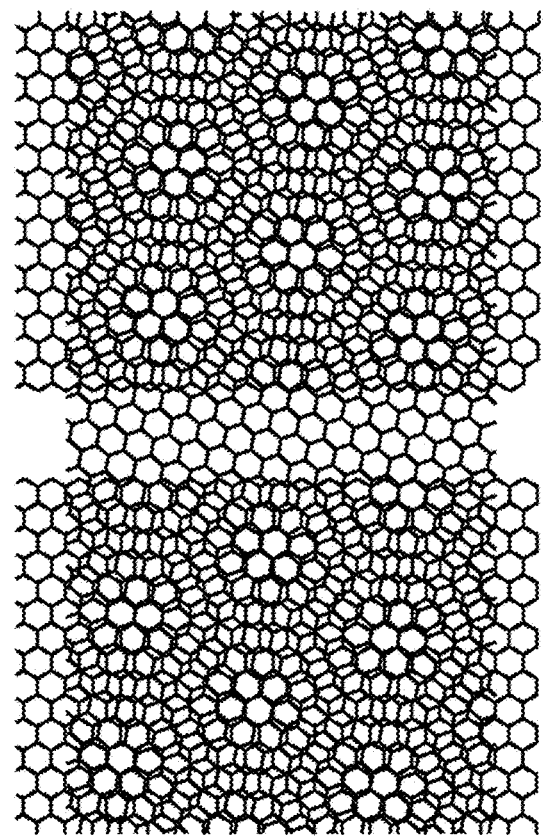
Fig. 9a
Fig. 9b

INTEGRATED MULTI-TERMINAL DEVICES CONSISTING OF CARBON NANOTUBE, FEW-LAYER GRAPHENE NANOGAPS AND FEW-LAYER GRAPHENE NANORIBBONS HAVING CRYSTALLOGRAPHICALLY CONTROLLED INTERFACES

RELATED APPLICATIONS

This application claims priority to U.S. Provisional Patent Applications 62/084,283, filed Nov. 25, 2014, and 62/091,192, filed Dec. 12, 2014, which are hereby incorporated by reference in their entirety.

TECHNICAL FIELD

The present invention relates generally to the presence of atomically-thin materials that have a common crystallographically alignment to commensurate nanogap electrodes and nanoribbons. These nanogap electrodes and nanoribbons are unique in that they provide the exact same crystallographic interface to the channel and provide precisely-tuned behaviors and methods of manufacturing such. These controlled electrode interfaces could significantly reduce contact resistances and provide new quantum transport functionality of devices.

BACKGROUND

As electrical multi-terminal devices are made smaller, the contacts to the electrodes are critical to their overall performance and are typically 'weak links' where significant wasteful deleterious dissipation occurs (Emerging Research Materials International Technology Roadmap for Semiconductors 2011). This obstacle to device-size reduction is a major impediment to the utilization and control of high-mobility materials such as carbon nanotubes (CNTs) and graphene as device channels for high-frequency applications and in reducing their deleterious excess heat production (Franklin et al. Nature Nanotechnology 2010, 5, 858-862; Xia et al. Nature Nanotechnology 2011, 6, 179-184). Maintaining the same crystallographic orientation at all electrode interfaces of a device could allow for the emergence of quantum behavior, such as ballistic and phase coherent transport. Such quantum transport could achieve new functionality, such as resonant tunneling and negative differential resistance, that could be useful for high-speed applications. Thus, a method to tune and significantly increase electrical coupling between high-mobility electrodes and channels is crucial for reducing the contact resistances and widening the possible functions of nanoscale devices.

SUMMARY OF THE INVENTION

The present invention provides a multi-terminal device, comprising a substrate with an atomically-thin source electrode and an atomically-thin drain electrode both on a top surface thereof. The source electrode and the drain electrode are separated by a nanogap of between 0.3 and 100 nm. The electrodes are crystallographically commensurate with each other, and at least one atomically-thin channel material crystallographically aligned with at least one electrode bridges the nanogap to form a device architecture. In certain embodiments, the channel material is perpendicular to the nanogap and in others the channel material bridges the nanogap in accordance with the lattice parameters of the electrode. The channel material is atomically-thin in a basically 2D structure, and by way of example and not limitation includes carbon nanotubes, graphene, BN, MoS2, WSe2, and metal dichalcogenides. In further embodiments, the channel material comprises multiple atomically-thin channel entities (such as two carbon nanotubes) that bridge the nanogap and may be parallel to each other.

The present invention further includes the option of placing a nanoribbon, such as a nanoribbon of an atomically-thin material within the nanogap. The nanoribbon may be comprised of graphene. The presence of nanoribbon can provide a functional gate for the device or a commensurate nanoscale electrical contact to the channel.

The multi-terminal device may further comprise a dielectric layer and a conducting layer, wherein the dielectric layer is positioned between the device architecture and a conducting layer.

In certain embodiments, the nanogap is a crystallographically uniform channel between the graphene source electrode and the graphene drain electrode.

The arrangement and properties of the materials within the device architecture allow for each material of the device architecture to be atomically thin.

The present invention further provides a method of preparing the multi-terminal devices, steps of which include:
 providing a source electrode and a drain electrode on a substrate material that are separated by a nanogap, wherein the source electrode and the drain electrode are crystallographically commensurate with each other; and,
 depositing a channel material that bridges across the nanogap, wherein the channel material has the same crystallographic orientation to both electrodes.

In certain embodiments, the channel material may comprise at least one nanotube or conducting atomically-thin channel material. In other embodiments, more than one nanotube or atomically-thin conducting channel may bridge the nanogap, and in further embodiments, at least two nanotubes or the atomically-thin conducting channels bridging the nanogap are parallel.

In certain embodiments, the nanogap provides a crystallographically uniform channel between the graphene source electrode and the graphene drain electrode, such that the interface with each electrode is commensurate.

BRIEF DESCRIPTION OF THE DRAWINGS

FIG. 2a shows an illustration of proposed CNT-graphene nanogap device. FIG. 2b shows an illustration of a method to alter electrical coupling between the CNT and the graphene interfaces by tuning their relative lattice orientations, while maintaining the same crystallographic orientation at both electrode interfaces. FIG. 2c shows atomic force microscope image of a lattice-aligned CNT which has been successfully grown over a graphene nanogap. FIG. 2d shows scanning electron microscope image of our growth of lattice-aligned CNTs on graphene from Ref. [25].

FIG. 4a shows a 3D illustration of proposed atomically-thin device utilizing a grapheme nanoribbon gate electrode. FIG. 4b shows a scanning electron microscope image of successful growth of a carbon nanotube across a graphene nanogap containing a nanoribbon which can be used as a third commensurate electrode.

FIG. 5b shows a histogram of length versus angle for the CNTs and etch tracks in (A). FIG. 5c shows a magnified view of the dashed square region in (A). The arrows in (C) point to the FLG (solid), a CNT (dashed), and the exposed $SiO_2$ evident through the etch track (dotted).

FIG. 8c shows the calculated energy for the lowest energy mode of oscillation for a SWCNT to vibrate its tip by δ=0.246 nm as a function of CNT radius and nanogap width using the parameters h=0.066 nm and E=5.5 TPa. FIG. 8d shows the calculation of the energy for a SWCNT to vibrate its tip by δ=0.246 nm using a conservative choice of parameters with h=0.066 nm and E=1.28 TPa. The bold, solid lines in FIGS. 8b, 8c and 8d are equal to the value of 75.0 meV. This work demonstrates that over extremely short ~10 nm spaced nanogaps, atomically-thin channel materials are rigid enough to have the same crystallographic orientation with respect to the two electrodes.

FIG. 9a shows commensurate graphene electrodes with a rotated graphene layer bridging the nanogap. FIGS. 9b and 9c show side views of FIG. 9a with arrows indicating the path of charge carriers. FIG. 9d shows incommensurate graphene electrodes with a different moiré pattern at each interface.

DETAILED DESCRIPTION

Figure 1:
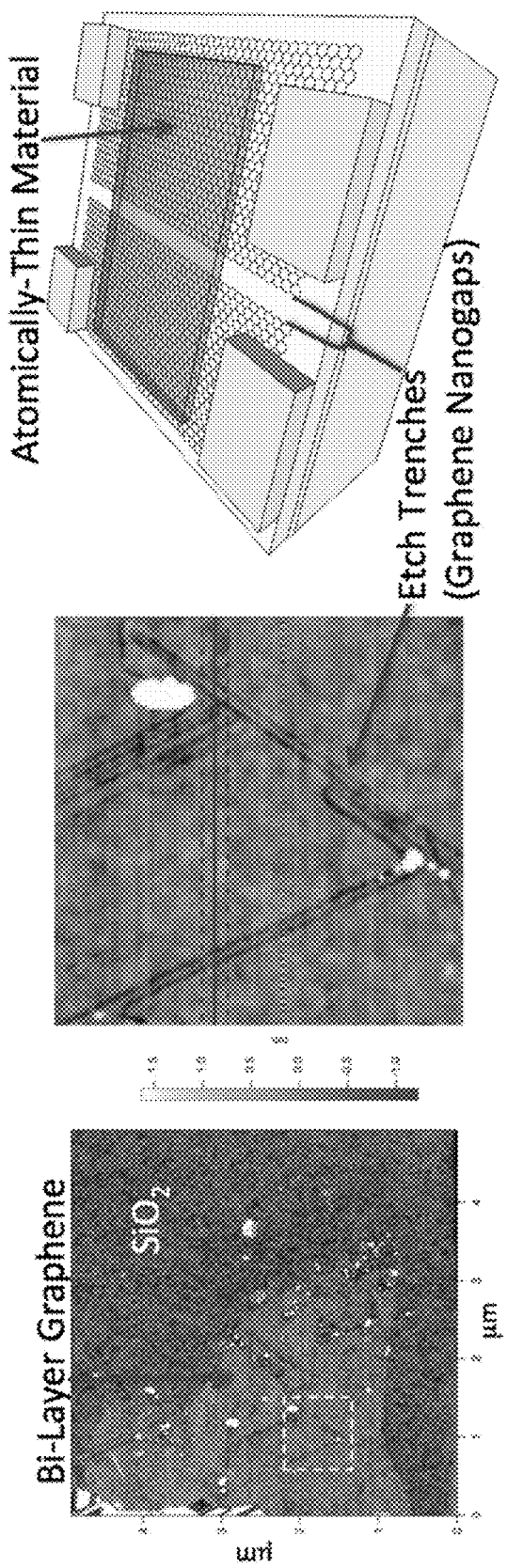
FIG. 1a shows atomic force microscope image of an etched bi-layer graphene film on an $SiO_2$ substrate.
FIG. 1b shows enlarged image of region within the 1 μm dashed box in FIG. 1a showing long etch tracks which can be used as stable nanogaps.
FIG. 1c shows an overview illustration of proposed devices consisting of an atomically-thin layer deposited on top of the graphene nanogap connected to macroscopic external electrodes (in yellow).

To effectively probe and control coherent transfer at nanoscale interfaces requires highly-precise commensurate electrodes that maintain the exact same crystal orientation at both the in-going and out-going interfaces of nanostructures. Without nanostructures that achieve this high degree of order at their electrodes, the fundamental coherent scattering effects at their electrical interfaces will likely remain obscured for these important classes of material components. The present invention provides highly-ordered atomically-thin commensurate nanoscale electrodes that provide coherent electron transfer to another atomically-thin material (denoted as the channel material). Increased electrical coupling can be provided by this common crystal orientation for specific states in the channel and the electrodes. Crystallographic-alignment between the channel material and the electrodes is one particular commensurate arrangement that is expected to provide low-dissipation quantum electrical contacts.

For example, when the electrodes of the conducting nanostructure are commensurate then the moiré superlattices will be the same at all electrode interfaces (as illustrated in FIG. 9a) making it possible to observe the phase coherent transport effects as the carriers pass in and out through the electrode interfaces (with FIGS. 9b and 9c showing the sideways view of such interfaces). In the incommensurate case (FIG. 9d), the moiré superlattices are no longer identical at the electrode interfaces, resulting in different scattering and a loss of phase coherence. Thus, ultrashort commensurate electrode systems are ideal for realizing phase coherent transfer at electrode interfaces.

The present invention utilizes atomically-thin materials that bridge commensurate source and the drain electrodes, thereby providing improved coupling. This increased electrical coupling provides a foundation upon which nanometer-scale devices with reduced contact resistance can be constructed. For example, as demonstrated in the examples herein, carbon nanotubes (CNTs) can be directly grown over few-layer graphene nanogaps with precise crystallographic alignment with graphene source and drain electrodes. In addition, the interface between nanotubes and few-layer graphene provides a tunable parameter that determines the behavior for ultra-short integrated devices consisting of these materials. Such integrated multi-terminal devices can also be used as coherent electron interference devices due to the potentially strong electrical coupling between these constituent materials and the resulting short relevant length scales.

The devices of the present invention thus comprise an atomically-thin source electrode and an atomically-thin drain electrode separated by a channel, such as a nanogap. Bridging the nanogap is an atomically thin channel material. The channel material is crystallographically aligned with both the source and drain electrodes. By way of example, suitable atomically-thin materials for the channel material include carbon nanotubes, graphene, transition metal dichalcogenides (like $MoS_2$ and $WSe_2$), black-phosphorous, and few-layer versions of these materials.

As set forth in the examples, multi-terminal devices of few-layer graphene electrodes, separated by a nanogap (optionally with a nanoribbon therein) and a carbon nanotube channel material demonstrate variable and increased electrode coupling. The present invention thus provides in part for integrated multi-terminal devices constructed with few-layer graphene nanogap (GNG) electrodes and nanogaps there between and/or few-layer graphene nanoribbons (GNR) separating the GNG. This device architecture can be used to construct a multitude of atomically-thin devices having uniform nanometer-scale channels and uniform nanometer scale gate electrodes for electrostatically controlling the channel. The GNG electrodes and integrated GNRs can incorporate crystallographically-aligned carbon nanotubes as the channel material. That there is crystallographic alignment of the nanotube with the GNG electrodes allows for excellent electrical coupling between the channel and the electrodes which provides significant reductions in contact resistances—a significant barrier to improved nano-electronic device performance. The carbon nanotubes directly grow onto the GNG electrodes in crystallographic alignment, providing a synthesis that can be readily scaled up to the fabrication of a plurality of devices in one processing sequence. A similar multi-channel device consisting of a plurality of aligned nanotube channels is also achieved with the methods and properties described herein. The nanometer scale and excellent electrical coupling between these aligned nanotubes permits coherent transport across the parallel nanotube channels. This coherent phenomena allows for the construction of novel resonant and interference devices. The integrated GNG-GNR architecture can also be utilized for other channel materials, such as the layered dichalcogenides (like $MoS_2$), conducting polymer films, organic-molecular films, and graphene. Since the GNG electrodes are atomically flat, they will permit molecular films and other atomically-thin layers to conform to their surface. Finally, these atomically-thin devices can be further integrated with atomically-thin nanoribbon gate electrodes for improved electrostatic control.

The present invention provides for at least two graphene electrodes, separated by a gap, such as a nanogap. A nanogap may be achieved through devices such as etching. Edges of an etched nanogap may be in a zig-zag shape, reflecting the cut geometry of graphene. Graphene may comprise a single atomic layer or higher. As would be understood to those in the art, a single piece of graphene may be cut in to two separate electrodes with a gap between them, such as an etched nanogap. Optionally, between the two electrodes lies a nanoribbon of 10 nm width or less that may provide a gate function between the electrodes or as an alternative charge injection route to the channel. The graphene electrodes rest on a substrate material such as $SiO_2$, $Al_2O_3$, or BN. Across the nanogap, channel materials, such as carbon nanotubes, such as single walled or multi-walled nanotubes, bridge the graphene electrodes. Growth of nanotubes across a nanogap is crystallographically aligned with the graphene, such that they are aligned with the lattice structure of the graphene electrodes (e.g., at angles of 30° or 90°), which demonstrates that the channel has the exact same crystallographic orientation to the nanogap electrodes. One or more nanotubes may be provided that bridge the gap across the channel material. In the instance of two or more nanotubes, the present invention provides that all or some may be parallel to each other. Optionally, covering the nanotubes may be a dielectric layer, and/or an additional conducting layer that may function as a gate.

The present invention provides in part for device with a uniform, crystallographic nanogap. The devices comprise two electrodes with the same crystal structure separated by a uniform nanogap of a single channel material with the same crystal orientation to each electrode. The channel material can be optionally replaced with a stack of channel materials with all, or a subset, of them having specific crystal orientation with the electrode. Further, as the crystal orientation can strongly affect the contact resistance of ultra-short nanoelectronics, these devices provide a route for significantly reducing and engineering the contact resistance.

These features allow for a wide array of varying devices to be achieved. The devices provided by the features of the present invention allow for all the materials present within the device to be optionally atomically-thin (~1 nm or less).

The devices enabled by the present invention further provide a channel grown to the electrodes having the same relative crystal orientation to each electrode. The present invention also provides in part for devices where a plurality of separate channels are grown between electrode pairs.

The present invention also enables devices where the same crystallographically uniform channel connects a plurality of nanogaps, each having the same relative crystal orientation to the electrodes. For example, a single nanotube may connect three graphene electrodes across two graphene nanogaps. The present invention also provides devices as discussed herein where a subset of the electrodes have ~10 nm width or less. For example, a single nanotube may connect three or more graphene electrodes across two or more graphene nanogaps wherein at least one of the electrodes is ~10 nm or less. Such features can induce novel properties at the size-confined interface between the channel and the electrode. Also, this is useful for scaling up with circuitry, since the size-confined electrode could also show unique device relevant phenomena.

The present invention also enables devices where the channel may not be crystallographically uniform, but instead both uniform nanogap and electrode sizes yield the ability to apply a uniform electric fields and currents to the channel film.

The present invention also enables devices where the channel may or may not be atomically-thin, but the uniform nanogap and electrode sizes provide the ability to apply uniform electric fields and currents to the channel film within a region in close proximity to the nanogap locations.

The present invention also enables devices where the relative crystal orientation between the channel and the electrode can be tuned, thus causing strong modification of device properties. The devices herein have demonstrated the ability to alter nanotube position on etched graphene and such a feature provides the ability to modify device behavior and contact resistances due to the crystal orientation being altered.

The present invention also enables devices where the overlap between the channel and the electrodes can be tuned, thus causing strong modification of device properties. This can further provide modified device behavior contact resistance due to the size of the contact region being modified. For example, it can lead to rectification and function as a high-speed light emitting diode.

The present invention also enables devices where the structure is lithographically sliced into a plurality of identical devices.

The present invention also enables devices where the application of an outside stimulus or substance perturbs the perfection of the relative crystal orientations causing notable changes to the overall device response. Such a feature is beneficial in devices such as sensors since the interface can be strongly dependent on external stimuli.

To further examine the more salient features of the present invention, FIG. 1a shows catalytically-etched bi-layer graphene that is situated on an insulating SiO$_2$ substrate. In the enlarged image (FIG. 1b) the dark lines are the etch tracks which are etched completely down to the insulating substrate. The etch track widths are determined in part by the size of a catalyst particle and can be sub-10 nm in size. The devices enabled by the present invention are based in part on the utilization of these etch tracks to construct devices like the one schematically shown in FIG. 1c. In such a device, the few-layer graphene (FLG) acts as both the source and drain electrodes with an atomically-thin channel bridging the two electrodes. The fact that the source and drain electrodes are atomically flat in the GNG structure permits the utilization of a variety of atomically-thin channel materials since they will be able to conform to the electrode topography.

Carbon Nanotube—Graphene Nanogap Devices

The present invention provides in part for carbon nanotubes as a channel material across a nanogap between commensurate graphene electrodes. The hybrid nanotube-graphene-nanogap architecture modifies and significantly reduces the contact resistance is illustrated in FIG. 2a. This device architecture consists of a channel material (exemplified by carbon nanotube (CNT)) that bridges two graphene electrodes separated by a nanogap with a size ≤10 nm. In this arrangement, the CNT channel is held onto the surface of the graphene through van der Waals (vdW) interactions that further provides the ability to tune this material interface of the device. Coupling of CNTs suggests that sp$^2$ carbon materials with lattice alignment could result in transfer lengths below 10 nm. This implies that such nanometer-scale devices consisting of crystallographically-aligned nanotubes and graphene electrodes should have extremely low contact resistances—making them ideal for future electronic applications. Since the nanotube is connected to the few-layer graphene surface through vdW bonding, one can modify their relative crystal orientations and thus the properties of the device.

FIG. 2c shows an atomic force microscope (AFM) image of a CNT which was grown over a graphene nanogap that was synthesized through catalytic etching. Since catalytic etching and CNT growth on FLG occur predominantly along specific crystal orientations (as demonstrated in FIG. 2d), there is a high probability of obtaining CNTs with exactly 90 degree orientation with respect to the nanogaps. This makes the synthesis of a plurality of such devices with the exact same crystal orientations possible.

Nanoribbon and Atomically-Thin Gate Electrodes for Few-Layer Graphene Nanogap Devices Strong gate coupling to the channel is important for many applications. This can be achieved through deposition of atomically-thin conductors which are separated by an atomically-thin dielectric (as illustrated in FIG. 3a). Alternatively, in order to make a narrow gate electrode, a nanoribbon can be incorporated into the nanogap device, as illustrated in FIG. 3b. FIG. 3c shows another image of how such a GNG device is integrated with a nanoribbon. FIG. 3d shows such a structure, where a CNT bridges the etched gap between two larger few-layer graphene regions. Between the larger FLG regions is a narrow graphene nanoribbon which can be used as the third gate electrode.

Multi-Nanotube Graphene-Nanogap Coherent Interference Devices

Multiple parallel nanotubes can be used as channels to GNGs, as illustrated in FIG. 4a. Due to the excellent conductivity between CNTs and graphene in addition to the small length scales of the device, the device behavior should reflect the coherent transport of electrons across it. This can result in novel devices that have an output current that depends on the interference between the multiple nanotube channels. FIG. 4b shows an example of one such multi-nanotube channel that bridges a few-layer graphene nanogap.

Methods

The present invention also provides for methods of manufacturing and assembling the devices contemplated herein. Essentially, the method incorporates introducing carbon nanotubes across a nanogap and or a nanoribbon. By way of example and not limitation, p+-doped silicon substrates can be cleaned and then subjected to UV-ozone (UVO) cleaning. Next, to deposit graphene, kish graphite can exfoliated onto the substrates, followed by the electron beam evaporation of a nominal layer of nickel. The device may then be placed in furnace to be first annealed to facilitate the formation of nickel catalyst nanoparticles, immediately followed by increased heating for CVD of nanotubes. After the high-temperature processing step, the samples may then passively cool to room temperature. Alternatively, strain engineering of the nanotube growth could permit alternative crystal orientations of the nanotube-electrode interfaces. Other atomically-thin materials (like transition metal dichalcogenides) could likewise be grown via van der Walls epitaxial growth directly over the nanogaps to form similar crystallographically-commensurate nanoscale devices.

EXAMPLES

One of the ultimate goals driving the fields of nanoscience and nanotechnology has been the attainment of atomically precise construction of intricate integrated systems consisting of materials with diverse behavior. Specifically, it is desirable to have high performance conductors, semiconductors, and insulators integrated into complex atomically precise arrangements (Lu et al. Nat. Mater. 6:841 (2007)). The importance of atomic precision in nanoscale synthesis is further supported by the fact that there has been work indicating that the precise crystal orientation and interface quality becomes increasingly important as the individual nanomaterial components are reduced in size (Buldum et al. Phys. Rev. B 63:161403 (2001); Maarouf et al. Phys. Rev. B 83:045402 (2011); Buia et al. Phys. Rev. B 67: 113409 (2003); Hippps et al. Science 294: 536 (2001); Franklin et al. Nano Lett. 12: 758 (2012); Franklin et al. Nat. Nanotechnol. 5: 858 (2010); Xia et al. Nat. Nanotechnol. 6: 179 (2011)). Over the last few decades, a number of materials have attracted attention for future use in electronics as these nanomaterial components. One such component is the carbon nanotube (CNT), a form of sp 2 carbon that has a bandgap determined by its diameter and wrapping vector that leads to a wide variation of its possible transport properties—including both semiconducting and conducting behaviors (Saito et al. Physical Properties of Carbon Nanotubes, Imperial College Press, London 1998). CNTs have received considerable attention due, in part, to their high electrical mobility and thermal conductivity among other fascinating properties. Another potential nanoelectronic building block is graphene, which is a 2D form of the same sp 2 honeycomb structure contained in CNTs (Geim et al. Nat. Mater. 6: 183 (2007)). While graphene has many of the same potential advantages as CNTs, such as high carrier mobility, unless it is confined to segments ≈10 nm in size or less it does not contain an appreciable bandgap in comparison to small-radius semiconducting CNTs(Son et al. Phys. Rev. Lett 97: 216803 (2006)). As such, grapheme and few-layer graphene (FLG) may find a more obvious application in future electronics as nanoscale atomically thin conducting interconnects and leads (Prins et al. Nano Lett. 2011, 11, 4607; Tsutsui et al. Sensors 2012, 12, 7259; Standley et al. Nano Lett. 2008, 8, 3345; Cook et al. Appl. Phys. Lett. 2012, 101, 153501; Kane et al. Nano Lett. 2009, 9, 3586). Due to its strength and resistance to electrical breakdown, graphene is also attractive as a nanoscale conductor for its potential in sustaining large electrical current densities. A third material that may find use in future nanoelectronics is the insulator $SiO_2$ (Lee et al. Science 2008, 321, 385; Liao et al. Phys. Rev. Lett 2011, 106, 256801; Murali et al. Appl. Phys. Lett 2009, 94: 243114). Due to the ubiquitous use of $SiO_2$ in modern electronics, this material, or perhaps an alternative high-κ material, could likely find an integral use in future nanoelectronic architectures (Size et al. Physics of Semiconductor Devices, John Wiley & Sons, Inc., Hoboken, N.J., 2007; Ribes et al. IEEE Trans. Device Mater. Reliab., 2005 8: 1912).

The ability to integrate graphene, CNTs, and a dielectric-like $SiO_2$ into ordered nanoscale systems would represent a promising step towards achieving the integration of diverse nano material components into intricate architectures. Towards this goal, it has recently been discovered that FLG situated on insulating $SiO_2$ surfaces can be catalytically etched along specific crystal directions with tracks having widths of order 10 nm or less (Datta et al. Nano Lett., 2008, 8: 1912).

This is significant because it demonstrates the successful integration of nanoscale graphene and insulating regions having specific crystal orientations with respect to the graphene lattice. Moreover, when two etch tracks are closely spaced, their tendency to align along specific crystal directions can result in the formation of nanoribbons with crystallographic orientation relative to the rest of the graphene lattice (Datta et al. Nano Lett., 2008, 8: 1912; Campos et al. Nano Lett., 2009 9: 2600). In other work, CNTs have recently been shown to grow along specific crystal orientations on the surface of a FLG substrate (Hunley et al. ACS Nano 2011 5:6403; Nasseri et al. Carbon 2014 77: 958). While these ≈5-6 nm diameter CNTs are slightly too large to have an appreciable bandgap useful for many applications, this result is a step toward achieving the successful integration of a semiconducting nanomaterial and a conductor with crystallographic orientation. These above-mentioned results have demonstrated integration between two of the three desired components—CNTs, FLG, and a dielectric—though the successful nanoscale integration with crystallographic orientational order of all three has yet to be achieved.

Here, we demonstrate the successful integration of FLG, CNTs, and etch tracks exposing $SiO_2$ into nanoscale systems with precise crystallographic orientations. Specifically, CNTs are grown across nanogap etch tracks and nanoribbons formed within FLG films as a result of chemical vapor deposition (CVD) processing. Due to the fact that these three nanoscale components align along specific directions of a single-FLG lattice, their relative orientations are locked into precise values. This provides a potential route to achieve precise orientation of conductors, insulators, and semiconductors with nanoscale intricacy. Furthermore, the fact that the integrated alignment of CNTs and graphene occurs with minimal apparent influence from the underlying $SiO_2$ substrate suggests that it could also be achievable on other high performance insulators, such as high-κ dielectric materials that might play an important role as nanoscale building blocks in future electronics. Our results also suggest that the integrated formation can be achieved by growing CNTs directly over nanogap etch tracks and nanoribbons while maintaining crystallographic orientation with the underlying FLG. We have computed estimates of the vibrational energy of CNTs that indicate that multi-walled CNTs (MWNTs) and single-walled CNTs (SWNTs) should be capable of maintaining atomic registry with an underlying graphene lattice as they grow across a typical etch track, in agreement with our experimental results. These calculations also suggest that the observed integrated crystallographic alignment could be achievable for much smaller diameter semiconducting CNTs having larger bandgaps, as long as small catalyst particles can be stabilized on FLG.

Figures 5, 5A:
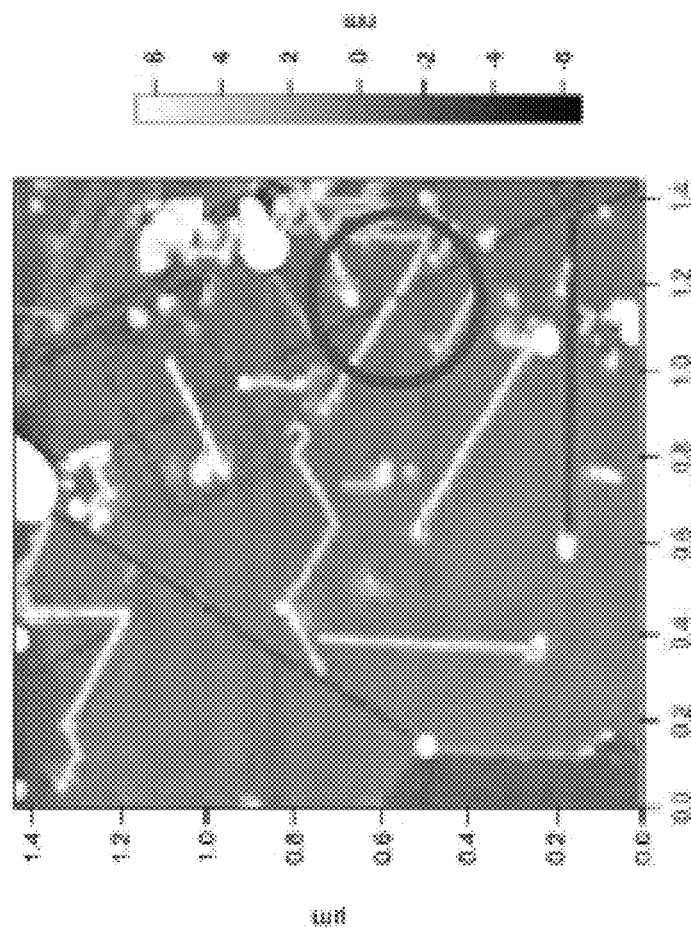
FIG. 5 shows an AFM image of a CNT traversing a graphene nanogap etch track.
FIG. 5a shows a 1.3 nm FLG sample with etched tracks (dark gray) and CNTs (white lines). The CNT circled by the solid line has been sliced by the catalyst particle that etched the adjacent track. The CNT inside the dashed rectangle traverses an adjacent etch track without having been sliced, indicating that it was grown directly across the commensurate nanogap electrodes.

FIG. 5a shows an atomic force microscope height image of a 1.3 nm layer thick FLG sample. The sample has had both the catalytic etching and the CNT growth performed on it through the CVD processing. The straight dark lines are the catalytic etch tracks down to the underlying $SiO_2$ substrate. For comparison to the etched regions, an exposed portion of the underlying substrate is observable at the lower-left of this atomic force microscopy (AFM) image. The white lines are CNTs that have grown on top of the FLG. While an applied feedstock gas can be used to control the growth of CNTs on the surface of FLG, the samples discussed here were prepared without one, as has been previously reported (Nasseri et al. Carbon 2014 77: 958; Campos et al. Nano Lett., 2009 9: 2600; Hunley et al. ACS Nano 2011 5:6403). For this case, when an applied feedstock is not applied, the specific source of carbon has not yet been determined; though the likely ones are the nearby catalytic etching (both inside and outside the view of the image in FIG. 5a) and possible residual surface contamination due to processing. Regardless of the specific source of carbon, the CNTs do not appear to be produced by catalyst particles that have been involved in the formation of etch tracks, and vice versa.

As has been reported previously (Hunley et al. ACS Nano 2011 5:6403), both the etch tracks and the CNTs preferentially form along specific crystal axes of the graphene—the etch tracks along the three zigzag directions and the CNTs along the three armchair directions of graphene. A histogram of overall length versus angle of the CNTs and the etch tracks in FIG. 5a is plotted in FIG. 5b, which clearly shows their preferred crystallographic orientations to the FLG lattice.

Due to these preferred crystal orientations, there are only a limited number of angles in which the etch tracks and CNTs will typically intersect. Previously, it had been observed that CNTs can be cut at these intersections (Hunley et al. ACS Nano 2011 5:6403). That is, a catalyst particle may simultaneously act to cut the FLG into two regions with an etch track and to slice a CNT on the surface into two pieces. Evidence for this dual-etching process is observed in the circled region in FIG. 5a, where the CNT appears to have been cut into two separate pieces directly at the location of the underlying etch track. While such a system comprises a CNT and some FLG in close proximity to insulating $SiO_2$, it does not represent an integration of these three components into an arrangement that is likely to be of use for future nanoelectronics. In this same image, we observe a distinctly different integration within the dashed rectangle of these three components with significantly greater potential for future nanoelectronics.

Figure 6:
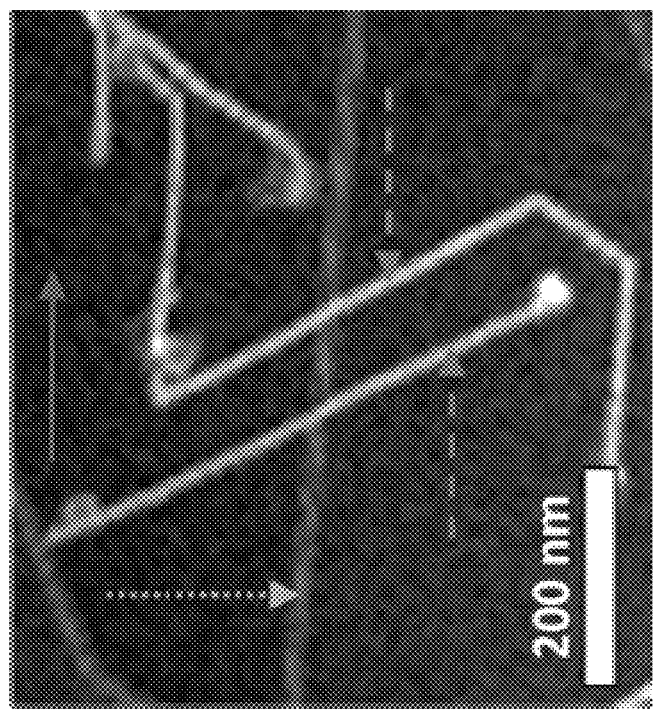
FIG. 6 shows a SEM image of two parallel CNTs traversing an armchair-directed etched FLG nanogap. The 3.8 nm thick FLG is the dark region (solid arrow), the CNTs are the lightest lines (dashed arrows), and the etch tracks exposing the underlying $SiO_2$ substrate are the gray lines (dotted arrow).

In this second region, the CNT completely traverses the etch track without being cut by a catalyst particle, as is clearly apparent by the enlarged AFM image of that region in FIG. 5c. The arrows in FIG. 5c point to the 1.3 nm layer FLG (solid arrow), the CNT (dashed arrow), and the exposed $SiO_2$ (dotted arrow). The preferred crystallographic orientations of the CNTs and etch tracks result in a limited number of preferred angles in which their integration is obtained. The preferred orientation is clearly evident in the thicker 3.8 nm thick FLG sample shown in FIG. 6 that has two nearby CNTs that traverse the same etch track. In the scanning electron microscopy (SEM) image of this sample, the FLG is the dark region (pointed to by the solid arrow), the CNTs are the lightest lines (pointed to by the dashed arrows), and the etch tracks exposing the underlying SiO2 substrate are the gray lines (pointed to by the dotted arrow). The striking result is that two nearby CNTs traverse the etch track in the exact same direction. The fact that the CNT is being locked into specific crystal directions of the underlying FLG lattice is evident by the abrupt changes in direction occurring in multiples of 60°. While thicker FLG samples tend to show less crystallographic alignment of the CNTs when grown using nearly identical conditions (Hunley et al. ACS Nano 2011 5:6403), this 3.8 nm thick sample still contains several localized regions demonstrating this crystallographic alignment of CNTs. We determine that the traversed etch track in FIG. 6 is along the armchair direction due to the fact that it is 30° offset from the dominant one (which is along the zigzag axis within the FLG flake (Tomita et al. J Phys Chem 1974 78: 2254). Thus, we conclude that the CNTs are aligned to a common armchair axis of the FLG which is, however, along a different direction to the etch track.

Figures 7, 7A, 7B:
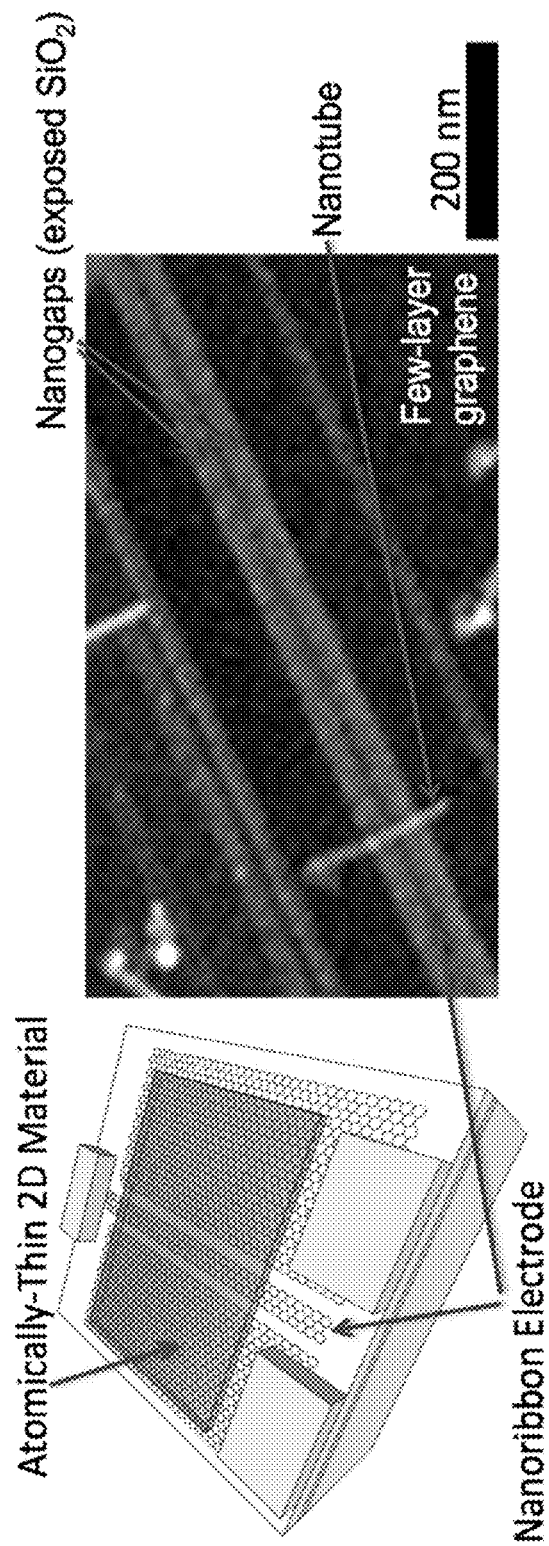
FIG. 7a shows a schematic of the integration of an atomically-thin 2D material with a graphene nanoribbon.
FIG. 7b shows a SEM image of a nanotube traversing two closely spaced etch tracks that bound a FLG nanoribbon. The dark line is the FLG nanoribbon (solid arrow) that has been formed through the two closely spaced etch tracks (dotted arrows) that expose the underlying $SiO_2$ substrate. The lightest line is the CNT (dashed arrow) while the other dark regions are 3.8 nm thick FLG.

Nanoribbons can also be integrated into crystallographically oriented structures consisting of CNTs, graphene, and insulating SiO 2 tracks. FIG. 7 shows an SEM image of another region of the same sample in FIG. 6 consisting of a crystallographically oriented FLG nanoribbon (pointed to by the solid arrow) that has been formed through two closely spaced etch tracks (pointed to by the dotted arrows) that expose the underlying SiO2 substrate. A CNT (pointed to by the dashed arrow) clearly extends between two separate FLG regions traversing both etch tracks and the imbedded nanoribbon. Since the etch tracks are along the zigzag axis, we conclude that the CNT is along an armchair direction since it makes an approximately 90M angle with the nanoribbon.

There are several possible mechanisms by which CNTs and etched graphene can be integrated together to form the intricate nanoscale structures we observe in FIGS. 5-7. Possible mechanisms include routes where: i) the CNT growth occurs first followed by etching of the underlying FLG (i.e., growth followed by etching (GFE)), or ii) the etching of the FLG occurs first followed by CNT growth over the etch tracks (i.e., etching followed by growth (EFG)). Since both etching and CNT growth both occur during the same CVD processing steps in our experiments, we are not able to decisively determine which of these mechanisms is involved in the construction of the integrated CNT-FLG nanoscale systems we observe. That being said, the fact that the sample in FIG. 5a consists of one CNT (within the circle) that has been cut by a catalyst particle performing etching while another (within the dashed rectangle) has not, suggests different mechanisms are involved in these two regions. Moreover, the EFG mechanism has the advantage in the formation of integrated nanoscale structures because in this sequence the CNT cannot be damaged or etched into two pieces as the catalyst particle moves past it. To realize this advantage of the EFG mechanism, the CNT must be capable of remaining rigidly aligned to the lattice of the underlying FLG as it crosses the etched void in order to remain in crystallographic orientation on both sides of the gap.

In order to determine whether the EFG mechanism could be involved in constructing integrated CNT-FLG structures like the ones we observe, we use Euler-Bernoulli beam theory (Han et al. J Sound Vibr 1999 225: 935) on the model illustrated in FIG. 8a. In this model, we assume that a CNT is growing across a nanogap from left to right between two pieces of FLG. As the CNT grows in length across the gap it requires less energy for its tip to make a displacement δ. If the thermal energy fluctuations are sufficient to cause a large enough displacement δ, we argue that the CNT will not remain crystallographic on the right side of the gap as it grows. This energy scale delineates a critical boundary between crystallographic and noncrystallographic growth of the CNT as it is integrated with an etch track in the FLG. While the required displacement δ required to disturb crystallographic growth is likely dependent on the detailed interactions between a growing CNT and the underlying FLG, which are as yet still not well understood, we can set it to a typical graphene lattice constant (i.e., δ=0.246 nm) in order to estimate this critical parameter boundary.

In this calculation of the critical parameter boundary, we make two other simplifications. The first is that the CNT remains rigidly fixed to the FLG surface on the left side and only bends in the gap region. The second assumption is that the entire mass of the Ni catalyst particle (with a diameter set equal to the CNT diameter) is concentrated at a single point on the end of the CNT. With these simplifications, the CNT is described by the time-dependent Euler-Bernoulli relation $$EI = \frac{\partial^4 y}{\partial x^4} = -\mu \frac{\partial^2 y}{\partial t^2},$$

where $\mu$ is the mass per unit length of the CNT, I is the moment of inertia, and E is the elastic modulus. With one clamped end and a point mass on the other, the CNT is subjected to the four boundary conditions $y(0)=0$, $y'(0)=0$, $y''(W)=0$, and $$y'''(W) = -\frac{m\omega_n^2}{EI} y(W),$$

where m is the mass of the catalyst particle and $\omega$ n is the frequency of the n th free oscillatory mode of the CNT. This leads to a transcendental relation, $$1 + \cosh(\zeta_n)\cos(\zeta_n) + \frac{2m}{\mu W^4}\zeta_n^4 \{\sinh(\zeta_n)\cos(\zeta_n) - \cosh(\zeta_n)\sin(\zeta_n)\} = 0,$$

where $$\zeta_n = \left(\frac{\mu \omega_n^2}{EI}\right)^{1/4} W$$

and the zeros determine the natural oscillating frequencies $\omega$ n of the CNT with a catalyst particle attached. Solving the time-dependent Euler-Bernoulli relation subjected to the boundary conditions yields for the first mode the solution $$y_1(x) = A \left\{ \cosh\left(\frac{\zeta_1 x}{W}\right) - \cos\left(\frac{\zeta_1 x}{W}\right) + \right.$$

$$\left. \frac{(\cosh(\zeta_1) + \cos(\zeta_1))\left(\sin\left(\frac{\zeta_1 x}{W}\right) - \sinh\left(\frac{\zeta_1 x}{W}\right)\right)}{\sinh(\zeta_1) + \sin(\zeta_1)} \right\} \quad (1)$$

where A is a free constant we use to require that the critical CNT tip displacement δ=y1(W), assuming higher energy modes do not contribute. Once the functional form y1(x) of the CNT displacement is fully determined, we compute its elastic energy at its extremum, $$U = \int_0^W \frac{EI}{2} \left(\frac{\partial^2 y_1}{\partial x^2}\right) dx,$$

which we estimate as the total energy stored in the vibrating CNT.

We compute this estimate of the energy of vibration for various widths, W, of the nanogap and radii of the CNTs for both MWCNTs and SWCNTs. To achieve the MWCNT calculation, we determine the moment of inertia assuming a solid rod, a mass density given by $\mu = \pi \, r \, 2\rho$ where ρ is the average mass per unit volume for graphite, and an elastic modulus given by E=1.28 TPa (Wong et al. Science 1997 277: 1971). For the SWCNT calculation, the rod must be modeled as an atomically thin-walled graphene tube. Theoretical work has previously shown that the flexural rigidity (D) and the in-plane stiffness (C=hE) of a single-graphene sheet can be consistently described through the use of an effective thickness of h=0.066 nm and an elastic modulus of E=5.5 TPa (Ru Phys Rev B 2000 62: 9973; Yakobson et al. Phys Rev Lett 1996 76: 2511.

For the following SWCNT calculation we will use this effective thickness and elastic modulus relevant for a single-shell grapheme tube. Since the bending of a thin-walled tube depends to lowest order only on C, the results we obtain are approximately the same as using the parameters consistent with bulk graphite, i.e., E=1.28 TPa and h=0.34 nm. In addition, for the SWCNT case the mass density is given by $\mu = 2 \, \pi r \sigma$ where σ is the average mass per unit area for graphene.

Figure 3:
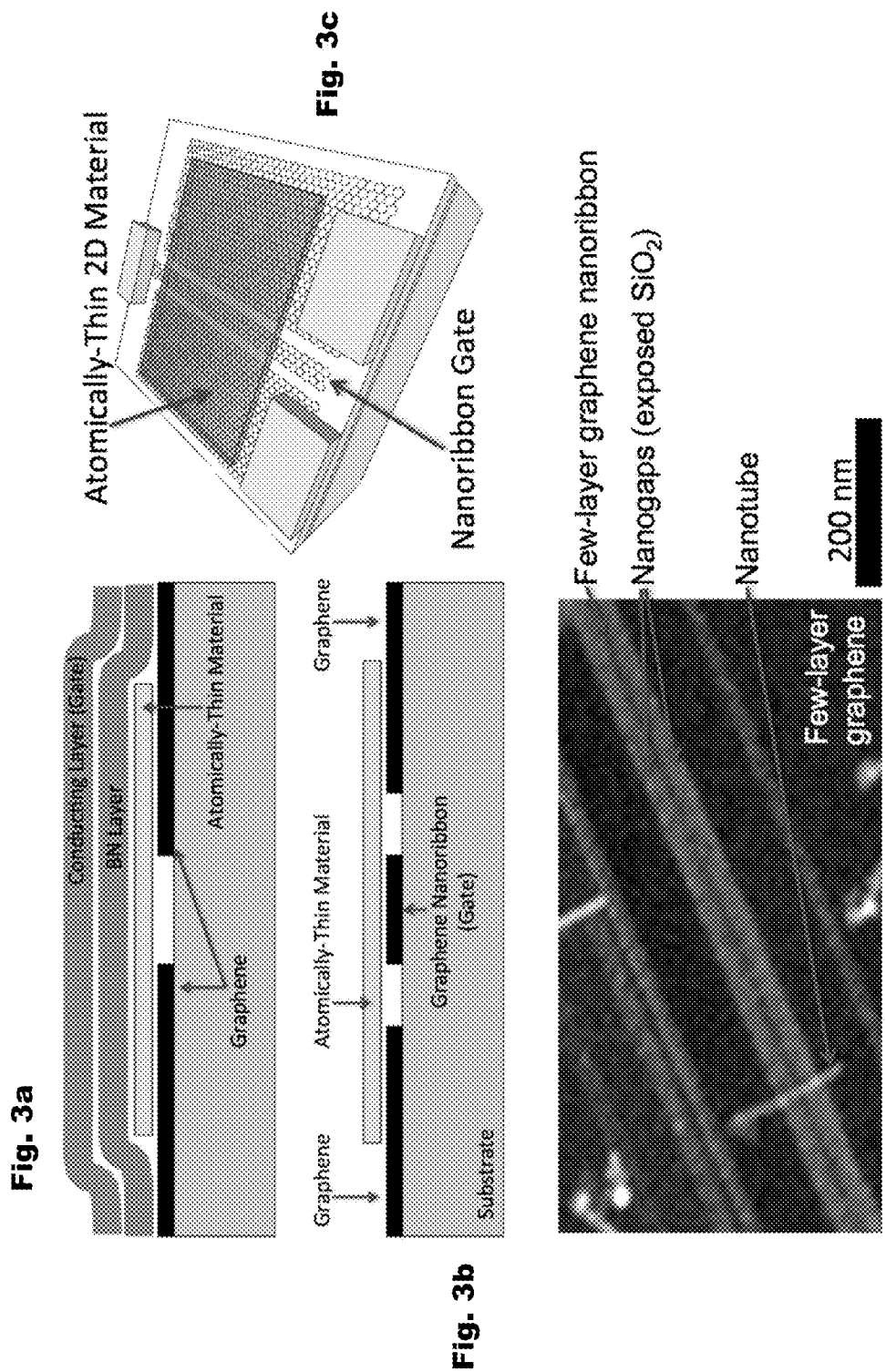
FIG. 3a shows a cross-sectional illustration of the present invention using an atomically thin BN layer to separate a top graphene (or other conducting layer) gate electrode from the atomically-thin channel.
FIG. 3b shows a cross-sectional illustration of proposed atomically-thin device utilizing a graphene nanoribbon as another commensurate electrode (useful for both injection of charge into the device or for electrostatic gate modulation).
FIG. 3C shows a 3D illustration of proposed atomically-thin device utilizing a graphene nanoribbon commensurate electrode (likewise, also useful for both injection of charge into the device or for electrostatic gate modulation).
FIG. 3d shows a scanning electron microscope image of our successful growth of a carbon nanotube across a graphene nanogap containing a nanoribbon which can be used as a third commensurate electrode.
Figures 8, 8A, 8B:
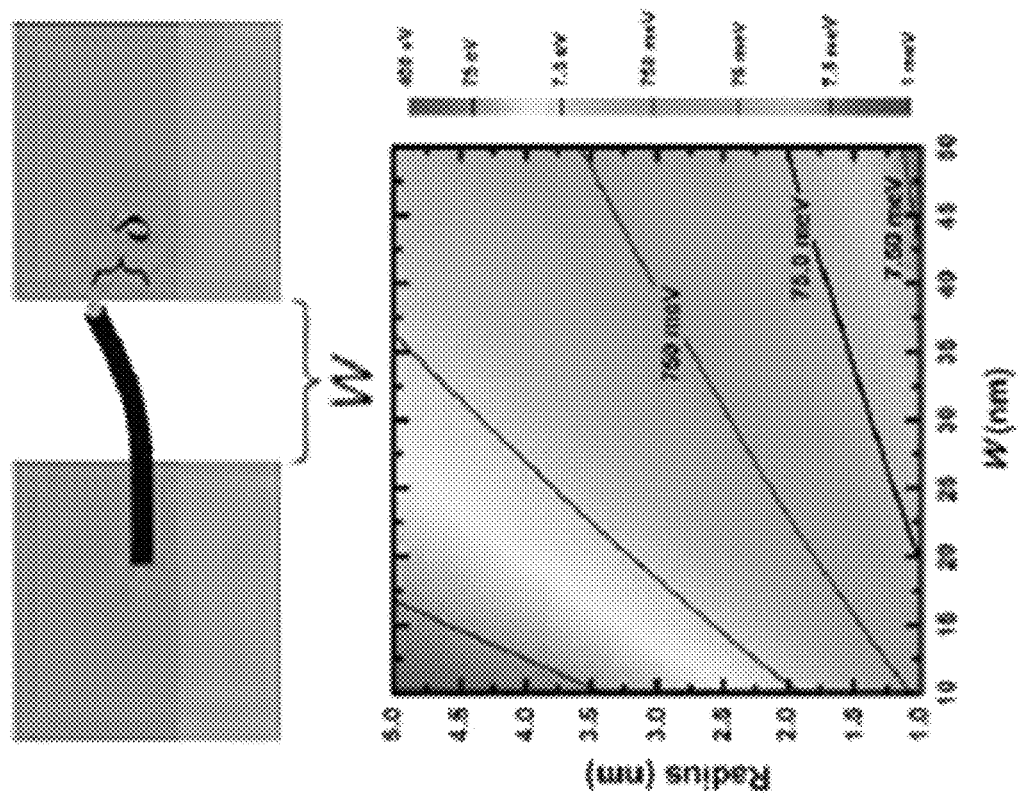
FIG. 8a shows a model of a CNT traversing a FLG nanogap. The width of the FLG nanogap is W and the deflection of the CNT tip with catalyst particle is δ.
FIG. 8b shows the calculated energy based on the model in FIG. 8a for the lowest energy mode of oscillation for a MWCNT to vibrate its tip by δ=0.246 nm as a function of CNT radius and nanogap width.

FIGS. 8b and 8c show the calculated energies of the lowest energy mode for the MWCNT (FIG. 8b) and the SWCNT (FIG. 8c) cases. In both Figures, a bold line is drawn at 75.0 meV, which is the approximate temperature scale of the furnace during processing. The upper-left region of the plot is the regime of larger diameter CNTs and shorter etched FLG nanogaps. The diameters (_5-6 nm) of the CNTs we experimentally observe integrated with FLG nanogaps of various widths in FIGS. 1,2 and 3 are well within this high energy regime—supporting the view that the integrated structures we observe could have been formed through the EFG mechanism.

According to FIG. 8b, as the nanogap is increased in size and the CNT radius is decreased, the energy required to significantly deflect the end of the CNT is reduced. However, this significant deflection is only relevant for nanogaps much larger than the ones etched in our samples or for CNTs with a much smaller radius. The calculations for the SWCNT case are qualitatively similar to the MWCNT case, but with a lower energy required for deflection. That said, the energy for deflection is calculated to be significantly greater than the processing temperature for SWCNTs with radii similar to the ones we observe across relatively large (W _30 nm) nanogaps.

To truly integrate semiconducting SWCNTs across FLG nanogaps, it is desirable to utilize the smallest radius CNTs that have the largest bandgaps. Although our calculations show a decreasing energy for deflection with radius, for the narrowest etched FLG nanogaps experimentally observed where W approaches 5 nm, CNTs with radii below 0.5 nm should still exceed the thermal energy scale. Thus, our calculations suggest that the smallest radii CNTs could be crystallographically integrated with extremely short (_5 nm width) FLG nanogaps. Even the results of a conservative estimate of the thermal energy, such as the one shown in FIG. 4d that uses an effective thin wall of h=0.066 nm and the lower elastic modulus of bulk graphite of E=1.28 TPa, gives a value greater than 75.0 meV for CNTs with radii below 0.5 nm growing across ≈5 nm nanogaps. The success of this conservative estimate demonstrates that the precise choice of physical parameters in our model does not alter our conclusions.

While we have previously obtained FLG nanogaps approaching the required width, the CNTs we have so far grown are typically between 5-6 nm in diameter on the thinnest FLG. This limitation on the width of the CNT diameter is likely due to the fact that the catalyst particles used to grow them are formed in thermal equilibrium with the underlying FLG, prior to CNT growth. Currently, it is thought that the cohesive energy within the nanoparticle competes with the electrostatic interactions with the FLG to drive such the system to form an equilibrium size that is typically greater than ≈5 nm (Luo et al. Nano Lett 2010 10: 777). This could explain why the method we have used produces CNTs with radii typically in this 5-6 nm regime. To overcome this CNT size limitation in the future, one might be able to utilize catalyst particles that are not allowed to come into equilibrium with the underlying FLG prior to CNT growth—thus permitting the diameters of the catalyst particles (and thus the CNTs) to be smaller. Finally, to achieve the ultimate limits in device scaling utilizing the CNT-FLG systems discussed here, it would be desirable to achieve this integration with single-layer graphene.

While clean crystallographic catalytic etching has been reported on single-layer graphene, such tracks are usually not as straight as those on FLG, which leaves another future avenue for improving this integrated system beyond the work presented here.

Sample Preparation

The fabrication of these integrated, atomic scale systems was achieved through the implementation of multiple processing steps. First, p+-doped silicon substrates having a 300 nm thermal oxide layer were cleaned through ultra-sonication in acetone, isopropyl alcohol, and deionized water for 3 min each using a Branson 2510 Bransonic Ultrasonic Cleaner. The substrates were then subjected to UV-ozone (UVO) cleaning in a NovaScan PSD Series Digital UV Ozone System for 15 min. Next, kish graphite was exfoliated onto the substrates, followed by the electron beam evaporation of a nominally 0.02 nm layer of nickel. Samples were then placed in a Thermo Scientific Lindberg Model TF55035C CVD furnace with MKS Type 247D Mass-Flo Controllers where they were annealed at 500° C. for 30 min to facilitate the formation of nickel catalyst nanoparticles. Immediately following this step, samples are heated to 1000° C. for 60 min. Throughout the entire CVD furnace processing, gas flows of 850 and 150 sccm of Ar and H2, respectively, are maintained. The furnace temperature is increased using a controlled ramp rate of 50° C. min−1. After the high-temperature processing step, the samples were allowed to passively cool to room temperature within the furnace.

Imaging: AFM imaging of the samples was performed with an Asylum Research MFP-3D AFM in tapping mode using Tap300Al-G probes from NanoAndMore USA and had nominal tip radii <10 nm. The AFM was used in the experiments for imaging and determining an estimate of the FLG thicknesses. SEM imaging was performed with a Zeiss Supra 35 field emission SEM with a Gemini column.

EFM Imaging

Nanostructured bi-layer graphene samples formed through catalytic etching are investigated with electrostatic force microscopy. The measurements and supporting computations show a variation in the microscopy signal for different nano-domains that are indicative of changes in capacitive coupling related to their small sizes. Abrupt capacitance variations detected across etch tracks indicates that the nano-domains have strong electrical isolation between them. Comparison of the measurements to a resistor-capacitor model indicates that the resistance between two bi-layer graphene regions separated by an approximately 10 nm wide etch track have a gap resistivity greater than about $3\times10^{14}$ Ω·nm. This extremely large gap resistivity suggests that catalytic etch tracks within few-layer graphene samples are sufficient for providing electrical isolation between separate nano-domains that could permit their use in constructing atomically-thin nanogap electrodes, interconnects, and nanoribbons.

Few-layer graphene (FLG) is an atomically-thin material having many beneficial properties, such as high carrier mobility, high thermal conductivity, and tremendous strength, which make it a potentially useful material for future nanoscale devices and integrated circuits (Geim et al. *Nature Materials* 2007, 6, 183-191; Jia et al. *Nanoscale* 2011, 3, 86-95; Nakada et al. *Physical Review B* 1996, 54, 17954-17961; Guimaraes et al. *Physical Review B* 2012, 85; Son et al. *Nature* 2006, 444, 347-349; Son et al. *Phys. Rev. Lett.* 2006, 97, Art. No. 216803; Barone et al. *Nano Lett.* 2006, 6, 2748-2754). To achieve this goal of utilizing FLG in nano-electronics requires the ability to construct nanoscale structures out of it (Geim et al. *Physics Today* 2007, 60, 35-41). To date there have been a number of approaches investigated to achieving nanoscale FLG (Cruz-Silva et al. *Physical Review Letters* 2010, 105; Jia et al. *Science* 2009, 323, 1701-1705; Lu et al. *Small* 2010, 6, 2748-2754; Ponomarenko et al. *Science* 2008, 320, 356-358; Kim et al. *ACS Nano* 2010, 4, 1362-1366; Han et al. *Phys. Rev. Lett.* 2007, 98, Art. No. 206805; Jiao et al. *Nano Research* 2012, 5, 292-296; Jiao et al. *Nature Nanotechnology* 2010, 5, 321-325; Jiao et al. *Nature* 2009, 458, 877-880; Lu et al. *Nano Letters* 2011, 11, 5184-5188; Borrnert et al. *ACS Nano* 2012, 6, 10327-10334; Fischbein et al. *Applied Physics Letters* 2008, 93, 113107-113103; Moser et al. *Applied Physics Letters* 2009, 95, 173506-173503; Standley et al. *Nano Letters* 2008, 8, 3345-3349; Kosynkin et al. *Nature* 2009, 458, 872-876; Cai et al. *Nature* 2010, 466, 470-473; Prins et al. *Nano Letters* 2011, 11, 4607-4611; Narita et al. *Nat. Chem.* 2014, 6, 126-132). One such approach which has received attention is the catalytic etching of few-layer grapheme (Datta et al. *Nano Lett.* 2008, 8, 1912-1915). This catalytic etching has long been known to result in crystallographically-defined etched domains and tracks in bulk graphite (Tomita et al. *J. Phys. Chem.* 1974, 78, 2254-2258). It has recently been found that many of the remarkable etch patterns obtained within bulk graphite persist to the FLG domain as well (Datta et al. *Nano Lett.* 2008, 8, 1912-1915)—even when the films are supported on amorphous insulating substrates (Campos et al. *Nano Letters* 2009, 9, 2600-2604). The fact that the crystallographic etch patterns can be obtained on insulating substrates indicates that catalytic etching could be a way to construct nanoscale electrically-isolated FLG segments useful for devices. While there have been a number of investigations probing the electrical properties of nanostructured FLG (Han et al. *Phys. Rev. Lett.* 2007, 98, Art. No. 206805; Jiao et al. *Nano Research* 2012, 5, 292-296; Liao et al. *Physical Review Letters* 2011, 106; Wang et al. *Phys. Rev. Lett.* 2008, 100, 206803; Chen et al. *Physica E* 2007, 40, 228-232), further measurements are required to understand and assess the effects of nanoscale processing and confinement. This is particularly true for nanoscale FLG obtained through catalytic etching that can be difficult to probe due to the close proximity of the nanoscale domains.

Here we use electrostatic force microscopy (EFM) to investigate catalytically-etched bi-layer graphene samples. EFM has recently been used to probe variations of the surface potential of FLG as its thickness varies (Datta et al. *Nano Lett.* 2009, 9, 7-11). In contrast to this previous work, we find an EFM signal that varies significantly between nanoscale FLG domains even though they have the same thickness. We obtain evidence that the change in the EFM response is due to changes in the capacitive coupling as the size of the nanoscale FLG domains is reduced. Furthermore, the fact that the EFM signal changes abruptly in going between adjacent domains gives a lower-bound estimate of their electrical isolation.

The catalytically etched graphene samples used in this investigation were prepared through mechanical exfoliation onto $p^+$-doped silicon substrates having a 300 nm thermal oxide layer (Novoselov et al. *Science* 2004, 306, 666-669), followed by processing in a chemical vapor deposition (CVD) furnace (Datta et al. *Nano Lett.* 2008, 8, 1912-1915; Campos et al. *Nano Letters* 2009, 9, 2600-2604). In the investigation that follows we focus in detail on a region of the sample containing only etch tracks with negligible amounts of CNTs grown on top of the FLG (Hunley et al. *ACS Nano* 2011, 5, 6403-6409; Nasseri et al. *Carbon* 2014, 77, 958-963).

We start with a bi-layer region (as shown in FIG. 8(a)) that has considerable etching and appears, according to AFM, to have several electrically isolated regions. The EFM method we utilize is a two-pass technique consisting of a conducting tip where the first obtains the topography and the second retraces the topography a fixed height of 36 nm above the surface. During the second pass the cantilever is driven close to resonance using the dithering piezo with a fixed applied bias between the tip and the doped Si back-gate substrate while the phase shift of the driven cantilever is measured. FIG. 8(b) shows such an EFM phase image acquired with a 7 V tip-substrate bias of the same etched bi-layer region as in FIG. 8(a). This image clearly shows that the various bi-layer regions have very different phase shifts for a constant bias. This difference in EFM response between electrically isolated bi-layer regions is further demonstrated by investigating the phase response as a function of bias. FIG. 8(c) shows such a comparison of the phase versus bias for the two regions within the square blocks in FIG. 8(b). Both regions show a parabolic phase response having their minima located at the same bias but with different concavities. This EFM behavior is distinct from previous measurements over multilayer graphene which, in contrast, show a constant concavity for such phase plots, but with minima that occur at varying voltages depending on the few-layer-graphene thickness (Datta et al. *Nano Lett.* 2009, 9, 7-11).

The EFM measurements can be understood by approximating the cantilever response as due to a total capacitance ($C_T$), a surface potential ($\varphi_S$), an applied electrochemical potential to the tip relative to back-gate ($V_{app}$), and a work function difference between the tip and back-gate ($\Delta W$). This provides a force gradient for the tip as a function of its vertical height (z) above the sample that alters the cantilever's resonance frequency (Bonnell *Scanning Probe Microscopy and Spectroscopy: Theory, Techniques, and Applications;* 2nd ed.; Wiley-VCH, Inc., 2001). For a cantilever driven at a fixed frequency near its resonance above a conducting sample surface, the change in the oscillatory phase is related to the force gradient through $$\Delta\varphi \cong \frac{Q}{k}F'(z_0) = \frac{Q}{2k}(V_{app} - \varphi_S - \Delta W)^2 C_T''(z_0), \quad (1)$$

where Q is the oscillator quality factor and k is the effective spring constant. For large-area graphene samples, the only term which varies appreciably for a constant tip-FLG height and tip material is the surface potential of the FLG which depends on its thickness. This results in nearly identical parabolic phase curves as a function of potential which are displaced according to the varying surface potential of the FLG (Datta et al. *Nano Lett.* 2009, 9, 7-11), in agreement with Eq. (1).

For the samples considered here, where all the FLG segments are bi-layer, the surface potential is relatively constant for the etched domains, and thus the phase-shift parabolas should all have the same voltage minima. However, different lateral positions above the sample should result in a variation of $C_T''(Z_0)$ due to differences in the capacitive coupling to the geometrically varying shapes of etched FLG below. This should result in parabolic phase-shift curves with different shapes but with minima located at the same voltage, like that shown in FIG. 8(c). Since the electrical coupling is strongest between the tip and the FLG directly below it, the geometry of this closest etched domain should make the greatest contribution to the curvature of the phase parabola. Evidence that this effect is the source of the different phase responses observed in FIGS. 8(b) and 8(c) is obtained by plotting the quadratic fitting coefficients of the EFM parabolas as a function of the surface area of the graphene segments below the tip, as shown in FIG. 9.

To understand this variation of the quadratic EFM response as a function of area, we have performed finite-element simulations of a tip over various geometrical arrangements of conducting sheets. The simulations were performed with a cylindrically-symmetric arrangement where the tip is located along the central vertical axis of the computational volume, given by a cylinder of height 5300 nm and radius 2820.95 nm. The cylindrical symmetry allows for the simulation of the fields within the entire volume to be simplified to that of a two-dimensional slice that significantly increases the speed and precision of the computations. A back conducting plane is placed on the lower surface of the cylindrical space with various arrangements of FLG domains located 300 nm above it, as seen in the vicinity of the tip in FIG. 10(a). The simulated conducting tip is given a total height of 4260 nm, a realistic radius of curvature of 25 nm and conical opening angle (as measured from the central axis) of 25 degrees, and its end is located a lift height z above the plane containing the FLG domains.

The first arrangement we consider consists of a single FLG domain of a specified area separated with a single 10 nm gap from a continuous larger surrounding domain with an outside radius of 2251 nm. The green dot-dashed line in FIG. 10(b) is the potential distribution along the radial direction of the FLG plane for a tip height of 36 nm resulting in a significant voltage drop across the 10 nm gap. By performing simulations at various tip heights from 32 to 40 nm we are able to estimate $C_T''$ at $z_0=36$ nm. The top dot-dashed green curve in FIG. 3(c) shows the results of such a computation as a function of the inner FLG domain area. While there is a clear dependence of $C_T''$ on area, the 4.30% change over this range, defined as $(C_{T\,max}'' - C_{T\,min}'')/C_{T\,max}''$, is not sufficient to account for the 22.5% change we observe in our measurements. This discrepancy does not appear to be due to a variation in etch track width, as the use of a 15 nm gap (which is larger than the size determine experimentally through AFM) in the calculations has only a minimal affect on the results, as seen by the purple dashed line in FIG. 10(c). In contrast, computations without an outside FLG sheet show a 34.0% change of $C_T''$ over the same range of areas (plotted as the dotted black curve in FIG. 10(c)), which is even greater than experimentally observed. This suggests that the FLG not directly below the tip affects the overall capacitance to an intermediate level between these two extreme scenarios. Direct support for this is obtained by simulating the surrounding etched FLG regions as concentric circular sheets of width 113 nm (i.e., a typical size for an etched domain in these samples) spaced by 10 nm gaps. This results in a 22.0% change of $C_T''$ shown by the solid red line in FIG. 10(c) that is in good agreement with the measured data (plotted as the blue triangles). A radial plot of the potential on the graphene surface for this intermediate scenario (the solid red line in FIG. 10b) shows a series of drops at the etched gaps that are largest close to the tip and that approach the profile without an outside sheet (the black dotted line) away from the tip. This suggests that the domain geometry not directly below the tip gives a non-negligible contribution to the EFM measurements. The scatter of the experimental data off of the simulated curve in FIG. 10(c) is likely due to variation in these nearby FLG domain arrangements not directly below the tip. Future experiments using coaxial EFM tips (Brown et al. *Nanotechnology* 2012, 23) might make it possible to shield the capacitive coupling to only the single closest etched FLG domain.

In the above simulations of $C_T''$ we have ignored effects due to the cantilever itself which can be important in EFM force measurements (Guriyanova et al. *Meas. Sci. Technol.* 2010, 21; Jacobs et al. *Journal of Applied Physics* 1998, 84, 1168-1173). This is justified in our EFM force gradient measurements, as is seen by using a parallel-plate approximation for the cantilever (Cherniayskaya et al. *Journal of Physical Chemistry B* 2003, 107, 1525-1531), where its width (W=28 µm), length (L=225 µm), and tip height (h=17 µm) are inserted into $C_{cant}=WL\epsilon_0/h$, $$C_{cant}' \sim -\frac{WL\epsilon_0}{H^2} = -1.93\times10^{-10} F/m,$$

and $C_{cant}'' \sim 2WL\epsilon_0/h^3 = 2.27\times10^{-5}$ F/m². Although this $C_{cant}'$ has a larger magnitude than the one we simulate, the estimate of $C''_{cant}$ is only ~3% of the value we compute, and can thus be neglected in the force gradient EFM measurements. In addition, our simulations only take the geometrical aspects of the capacitive coupling in the EFM measurements into account, and neglect the local surface potential. For large area FLG films that provide a surface with a nearly constant surface potential (like in the previous EFM measurements of FLG (Tsutsui et al. *Sensors* 2012, 12, 7259-7298)) the minima of the phase parabola should directly reflect the surface potential. In contrast, when the size of the FLG conducting region is small enough such that the tip appreciably couples directly to the back conducting plane, the phase minimum will not in general be directly related to the surface potential of the conducting FLG film.

The fact that the EFM phase response changes abruptly for adjacent etched bi-layer graphene segments in FIG. 8 permits a lower estimate of the resistive barriers provided by the etch tracks. For the etched system to act as electrically separated conducting FLG domains that maintain the voltage drops seen in FIG. 10(*b*), the resistance between them must be large enough to prevent their electrical equilibration over the time scale probed by EFM. Thus, the RC time scale for electrical equilibration must be greater than the characteristic EFM probing time ($\tau$) of the experiments as represented by the simplified two-capacitor circuit model in FIG. 4. In this model, the EFM probe is positioned over the first FLG domain ($G_1$) such that the tip only appreciably couples to it. An adjacent etched domain ($G_2$) having an overall different capacitive coupling to the environment is connected to $G_1$ through possible parasitic residual conductance across the etch tracks. Using this model, it can be shown that when either the scan time (the time over which the tip is located above a particular domain) or the oscillation time of the cantilever is less than the RC equilibration time that abrupt changes in EFM signal are possible in switching the location of the tip between $G_1$ and $G_2$. To obtain a lower-bound of the etch-track resistance we use the shortest of these scales, which is the oscillation time and is given by $\tau=2\pi/\omega_0$, where $\omega_0$ is the resonance frequency of the 67.461 kHz probes. The capacitance of a domain consisting of an outside perimeter of l=342 nm is estimated as $1.41\times10^{-17}$ F by using the simulations discussed above in FIG. 10 consisting of equally-spaced sheets. The resistance between etched segments is given by $R=\rho_{gap}/l$, where $\rho_{gap}$ is the resistivity of the gap (and not a bulk resistivity despite the similar units) which yields the entire resistance across it when divided by its length, l. A lower-bound to the gap resistivity can therefore be estimated from the RC time-constant using the above values to obtain $\rho_{gap} \geq lT/C = 3\times10^{14}$ $\Omega\cdot$nm. This extremely large gap resistivity indicates that the samples we have synthesized yield electrically isolated bi-layer regions.

In conclusion, we have made an EFM investigation of nanostructured bi-layer graphene samples that are formed by catalytic etching along narrow (approximately 10 nm wide) tracks. The measurements show a variation in the quadratic term of the EFM phase signal for different nano-domains of bi-layer graphene. Quantitative comparison to simulations indicates that the change in quadratic behavior is due to a decrease in the second derivative of the overall capacitive coupling as the closest nano-domain becomes smaller. The fact that abrupt capacitance variations can be measured across etch tracks indicates that the nano-domains have strong electrical isolation. Modeling the system as a RC circuit permits a lower estimate of the electrical isolation between etched nano-domains. This calculation gives a lower-bound estimate to the gap resistivity of $3\times10^{14}$ $\Omega\cdot$nm between two bi-layer graphene regions separated by an approximately 10 nm wide etch track. This extremely large gap resistivity suggests that catalytic etch tracks within FLG samples are sufficient for providing electrical isolation between separate nano-domains that could permit their use in constructing atomically-thin nanogap electrodes, interconnects, and nanoribbons.

The foregoing has been presented for purposes of illustration and description. It is not intended to be exhaustive or to limit the embodiments to the precise form disclosed. Obvious modifications and variations are possible in light of the above teachings. All such modifications and variations are within the scope of the appended claims when interpreted in accordance with the breadth to which they are fairly, legally and equitably entitled. All documents referenced herein including patents, patent applications and journal articles and hereby incorporated by reference in their entirety.

What is claimed:

1. A multi-terminal device, comprising a substrate with an atomically-thin source electrode and an atomically-thin drain electrode both on a top surface thereof, wherein the source electrode and the drain electrode are separated by a nanogap of between 0.1 and 100 nm and commensurate with each other, and at least one atomically-thin channel material with a uniform crystallographic orientation to at least one commensurate electrode, wherein the atomically-thin channel material is deposited on top of the source and drain electrodes and bridges over the nanogap to form a device architecture, wherein a first overlap between the atomically-thin channel and the source electrode and a second overlap between the atomically-thin channel and the drain electrode provide uniform electrical interfaces.

2. The multi-terminal device of claim 1, wherein the channel material has the same uniform crystallographic orientation to multiple commensurate electrodes.

3. The multi-terminal device of claim 1, wherein the channel material is perpendicular to the nanogap.

4. The multi-terminal device of claim 1, wherein the channel material is selected from the group consisting of, for example, carbon nanotubes, graphene, $MoS_2$, $WSe_2$, transition metal dichalcogenides, and black phosphorous.

5. The multi-terminal device of claim 1, wherein the channel material comprises a carbon nanotube or a nanotube constructed from another 2D material.

6. The multi-terminal device of claim 1, wherein the channel material comprises at least two carbon nanotubes or two nanotubes constructed from another 2D material that bridge the nanogap.

7. The multi-terminal device of claim 6, wherein at least two of the nanotubes are parallel to each other.

8. The multi-terminal device of claim 1, wherein within the nanogap lies at least one graphene nanoribbon commensurate with the other nearby graphene.

9. The multi-terminal device of claim 8, wherein the graphene nanoribbon functions as a gate.

10. The multi-terminal device of claim 8, wherein the graphene nanoribbon functions as an ultrashort nanoscale electrode (of approximately 10 nm or smaller width).

11. The multi-terminal device of claim 1, further comprising a dielectric layer between the device architecture and a conducting layer.

12. The multi-terminal device of claim 1, wherein the nanogap is between 0.1 nm and 10 nm.

13. The multi-terminal device of claim 1, wherein the nanogap is a crystallographically uniform channel between the graphene source electrode and the graphene drain electrode.

14. The multi-terminal device of claim 1, wherein each material of the device architecture is atomically thin.

15. The multi-terminal device of claim 1, wherein the source electrode is comprised of graphene.

16. The multi-terminal device of claim 1, wherein the drain electrode is comprised of graphene.

17. A method of preparing a multi-terminal device, comprising:
providing a source electrode and a drain electrode on a substrate material that are separated by a nanogap, wherein the source electrode and the drain electrode are commensurate with each other; and,
depositing a channel material on the source electrode and the drain electrode that bridges over the nanogap, wherein the channel material crystallographically aligns with at least one electrode and further wherein a first overlap between the atomically-thin channel and the source electrode and a second overlap between the atomically-thin channel and the drain electrode provide uniform electrical interfaces.

18. The method of claim 17, wherein the channel material comprises a carbon nanotube or other atomically-thin material.

19. The method of claim 17, wherein the other atomically thin material is selected from the group consisting of transition metal dichalcogenides, black phosphorous, and nanotubes formed from laminar materials.

20. The method of claim 17, wherein the source electrode is comprised of graphene.

21. The method of claim 17, wherein the drain electrode is comprised of graphene.

22. The method of claim 17, wherein the nanogap provides a crystallographically and spatially uniform channel between the graphene source electrode and the graphene drain electrode.

* * * * *